United States Patent [19]
Nelson

[11] 4,119,840
[45] Oct. 10, 1978

[54] FAST ACTING GAIN PHOTOCURRENT DEVICE

[75] Inventor: Kyler Fischer Nelson, Pittsford, N.Y.

[73] Assignee: Xerox Corporation, Stamford, Conn.

[21] Appl. No.: 672,192

[22] Filed: Mar. 31, 1976

[51] Int. Cl.² ............................................. H01J 39/12
[52] U.S. Cl. .................... 250/211 R; 357/30
[58] Field of Search ............ 250/211 R, 211 J, 213 A, 250/213 R, 330, 331; 338/15; 357/29, 30

[56] References Cited

U.S. PATENT DOCUMENTS

| | | | |
|---|---|---|---|
| 2,937,353 | 5/1960 | Wasserman | 250/211 R X |
| 3,500,101 | 3/1970 | Burns | 250/211 R X |
| 3,548,214 | 12/1970 | Brown | 250/213 R |
| 3,590,253 | 6/1971 | Novice | 250/213 |
| 3,609,359 | 9/1971 | Wainer | 250/213 R X |
| 3,958,207 | 5/1976 | Tutihasi | 338/15 |

*Primary Examiner*—David C. Nelms

[57] ABSTRACT

Gain photocurrent is promptly obtained by providing an insulating layer and a photoconductive layer placed between two electrodes with a biasing means sandwiched between the layers. The sandwiched structure in conjunction with an applied electrical potential and excitation light provides a fast acting electrical switching device. Optionally, an imaging layer can be included between the photoconductive layer and one of the electrodes, and can be promptly imaged with increased sensitivity.

13 Claims, 3 Drawing Figures

FAST ACTING GAIN PHOTOCURRENT DEVICE

BACKGROUND OF THE INVENTION

This invention relates to field-induced injection currents across insulating layers, and more particularly, to rapidly obtained high quantum yields thereof when the insulating layer is in contact with a biasing means and a photoconductive layer and the photoconductor is struck by suitable light.

Light is physically viewed as possessing the characeristics of wave motion and energy particles. The characteristic of an energy particle is generally attributed to the photon quantum of light. Generally speaking, when a photon quantum of light strikes a photoconductive material, one pair of charge carriers constituting a negative charge and a positive charge is created. Typically, one of the charge carriers of the pair of charge carriers moves in the photoconductive material struck by the photon quantum of light while the other remains substantially in the location of creation. The negative charge carrier is generally referred to as an electron while the positive charge carrier is generally referred to as a hole. It has been found that when light strikes a photoconductive material, one photon quantum of light is required to generate one pair of charge carriers. Thus, the maximum quantum efficiency, expressed as number of pair of charge carriers created per photon quantum of light, has a maximum value of 1. Typically, the quantum efficiency is less than 1.

In order to obtain photoconductive gain greater than unity, it has been generally felt necessary that Ohmic contact e.g., a reservoir of charge at the metal-photoconductor interface, be present. It was further generally felt that with a blocking contact to the photoconductor, e.g., a non-ohmic contact with a Schottky energy barrier at the metal-photoconductor interface, photoconductive gains greater than unity could not be achieved. See, for example, "Photoconductive Gain Greater than Unity in CdSe Films with Schottky Barriers at the Contacts", R. R. Mehta and B. S. Sharma, J. Appl. Phys., Vol. 44, No. 1, January, 1973. According to this article, the authors were able to achieve a photoconductive gain greater than unity with gold electrodes in contact with the photoconductor wherein the gold contacts were determined to be non-ohmic with a Schottky energy barrier between the electrode and the photoconductor and wherein the radiation utilized was bandgap radiation of the photoconductor. No insulating layer was deliberately inserted between the gold electrode and photoconductor.

Conduction through a physical, electrically insulating barrier is reported in "Thermally Assisted Tunneling in Dielectric Films", G. G. Roberts and J. I. Polanco, Phys. Stat. Sol. (a), 1, 409 (1970). In the latter article, the authors reported findings in the characteristic relationship between current flow in, and voltage applied to, an insulating organic layer sandwiched between two electrodes. No photoconductive layer is utilized and no mention is made of gain photocurrent.

Conduction through a semi-conductor layer adjacent a few-atoms-thin layers of insulating materials is theoretically presented in "The Physical Review B", F. Schmidlin, 1, 4, pages 1583-1587 (1970).

U.S. Pat. No. 3,732,429 discloses the use of an inorganic insulating layer in contact with a photoconductor in order to obtain a higher dark impedance in conjunction with a liquid crystalline layer. All three layers are sandwiched between a pair of electrodes.

Copending application Ser. No. 489,285, filed July 17, 1974, U.S. Pat. No. 3,958,207 discloses a method for obtaining gain photocurrent across an insulating layer in contact with a photoconductive layer sandwiched between a pair of electrodes. Gain photocurrent and thermal tunneling through the insulating layer are obtained after a short delay when light to which the photoconductive layer is responsive is impinged on the layer while an electrical potential is applied between the electrodes. In order to obtain a gain photocurrent in prompt response to activating radiation a low-intensity light is maintained on the photoconductive layer in the presence of an electrical field. The low-intensity light produces sufficient hole-electron pairs in the photoconductor to cause migration and buildup of a charge at the insulator-photoconductor interface. The buildup of charge is not in itself of sufficient strength to cause gain photocurrent. However, it is sufficiently strong to cause prompt thermal tunnelling through the insulating layer and gain photocurrent when light of a higher intensity strikes the photoconductor.

An apparatus and method for producing gain photocurrent promptly with activating light of a single intensity is desirable.

SUMMARY OF THE INVENTION

It is, therefore, an object of the invention to devise a novel system for providing gain photocurrent.

It is another object of this invention to create a novel method for producing gain photocurrent.

It is yet a further object of this invention to build a novel gain photocurrent device.

It is still yet a further object of this invention to make a novel electrical switching device.

It is still a further object of this invention to combine a gain photocurrent system with various imaging layers to enhance the imaging of said layers.

It is yet a further object of this invention to produce a photoconductor photocurrent of gain magnitude promptly in response to illumination.

These and other objects are obtained, generally speaking, by means of an insulating layer and a photoconductive layer having a biasing means sandwiched therebetween. Electrodes are placed on either side of the sandwich, and an electrical potential is applied across the layers. Gain photocurrent occurs promptly when the photoconductor is impinged with light to which it is sensitive.

Optionally, an imaging layer is placed between the photoconductor and one of the electrodes. The optical characteristics of the optical layer are changed by the photocurrent. If the light which strikes the photoconductor is in imagewise configuration, a similar imagewise pattern is produced in the imaging layer.

BRIEF DESCRIPTION OF THE DRAWINGS

For a better understanding of the invention as well as other objects and further features thereof, reference is made to the following detailed disclosure of the preferred embodiments of the invention taken in conjunction with the accompanying drawings thereof, wherein.

DESCRIPTION OF THE PREFERRED EMBODIMENT

Figure 1:
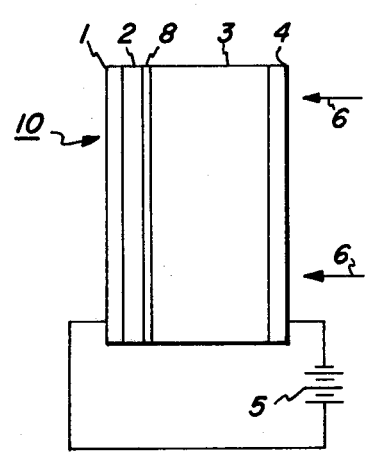
FIG. 1 is a schematic illustration of one embodiment of a device which provides rapid gain photocurrent in accordance with the invention.

Referring now to FIG. 1, the biased gain photocurrent device or electrical switching device of the present invention is generally represented as 10. The device comprises electrodes 1 and 4, insulating layer 2, electrical biasing means 8 and photoconductive layer 3. Layer 3 is at least about ten times as thick as layer 2.

Electrodes 1 and 4 comprise any suitable material which allows the provisioning from voltage source 5 of a potential across insulating layer 2 and photoconductive layer 3. Typical suitable materials include metals such as platinum, silver, tin, aluminum, gold, copper, indium, gallium; conductive metal oxides such as, for example, tin oxide, indium oxide; insulating substrates coated with conductive layers such as NESA glass comprising a thin coating of tin oxide over glass and commercially available from Pittsburgh Plate and Glass Company. In particularly preferred embodiments of the invention when characteristics of the photoconductive layer, electrodes and insulating layer are preferably matched in order to provide even a greater gain in photocurrent, the work function of the electrodes is selectively chosen to match the characteristics of the photoconductive layer and the insulating layer. "Work function" or derivation thereof is used herein in the conventional sense well known to those skilled in the art (for example see CRC Handbook of Chemistry and Physics, The Chemical Rubber Company, 51st edition, pE 87); and "high work function" is used herein to designate materials which have a work function at or above 4 eV while "low work function" is used herein to refer materials which have a work function below about 4 eV.

It has been found as described in detail in copending application Ser. No. 489,285, filed July 17, 1974, that an insulating layer, even a relatively thick insulating layer, in contact with the photoconductor provides a gain in photocurrent many times that of the primary photocurrent.

Any suitable insulating layer can be utilized in the present invention. Such layers may include insulating inorganic materials such as, for example, metallic oxides which are nonconductive and insulating organic materials. Suitable insulating organic materials include: zinc sulfide, poly(2-propene-anthracene), poly(2-vinylanthracene), poly[1-(2-anthryl)ethylmethacrylate], phenoxy resin — a high molecular weight thermoplastic copolymer of bisphenol A and epichlorohydrin having the basic molecular structure — $[OC_6H_4C(CH_3)_2C_6H_4OCH_2CH(OH)CH_2]_n$ where $n$ is equal to about 100 (the foregoing material being representative of insulating materials having a low ionization potential of below about 8 eV) polystyrene, polyvinylcarbazole, polyethylene, polycarbonate resins such as, for example, LEXAN — a thermoplastic carbonate linked polymer produced by reacting bisphenol A with phosgene, available from General Electric Company, the various parylenes such as poly-para-zylylene and poly-monochloroparaxylylene, a 65/35 weight percent copolymer of styrene and n-butylmethacrylate, a 70/30 weight percent copolymer of styrene and hexylmethacrylate (the foregoing being representative of insulating materials having "high" electron affinity above about 1.5 eV).

It will be understood, of course, that any suitable insulating layer can be used regardless of the value of its ionization potential (work function). However, for particularly preferred embodiments mentioned above and which will be described below, the ionization characteristics of the material utilized in the insulating layer 2 is appropriately matched with the characteristics of the photoconductive layer and the work function of the electrodes. Other typical suitable insulating material for insulating layer 2 include: classes of materials such as polystyrenes, alkyd substituted polystyrenes, polyolefins, styrene acrylic copolymers, styrene-olefin copolymers, silicone resins, phenolic resins, and organic amorphous glasses. Typical suitable materials include Staybelite Ester 10, a partially hydrogenated resin ester Foral Ester, a hydrogenated resin triester, and Neolyn 23, an alkyd resin, all from Hercules Powder Co., SR 82, SR 84, silicone resins, both obtained from General Electric Corporation; Velsicol X-37, a polystyrene-olefin copolymer from Velsicol Chemical Corp.; hydrogenated Piccopale 100, a highly branched polyolefin, HP-100, hydrogenated Piccopale 100, Piccotex 100, a copolymer of methyl styrene and vinyl toluene, Piccolastic A-75, 100 and 125, all polystyrenes, Piccodiene 2215, a polystyrene-olefin copolymer, all from Pennsylvania Industrial Chemical Co., Araldite 6060 and 6071, epoxy resins of Ciba; Amoco 18, a poly alpha-methylstyrene from Amoco Chemical Corp., ET-693, and Amberol ST, phenol-formaldehyde resins, ethyl cellulose, and Dow C4, and methylphenylsilicone, all from Dow Chemical; R5061A, a phenylmethyl silicone resin, from Dow Corning; Epon 1001, a bisphenol epichlorohydrin epoxy resin, from Shell Chemical Corp.; and PS-2, PS-3, both polystyrenes, and ET-693, a phenolformaldehyde resin, from Dow Chemical; and Nirez 1085 a polyterpene resin, available from Tenneco Corporation under that tradename.

Photoconductive layer 3 can comprise any suitable photoconductive material. Typical suitable photoconductive materials include photoconductive inorganic materials and photoconductive organic materials. Typical suitable inorganic photoconductive materials include sensitized zinc oxide, for example, sensitized by the addition of Rodamine Dye, available from Dupont, selenium, selenium alloyed with arsenic such as, for example, arsenic triselnide, tellurium, antimony or bismuth; cadmium sulfide, cadmium sulfoselenide, and the many other typical suitable inorganic photoconductive materials listed in U.S. Pat. No. 3,121,006 to Middleton et al and listed in U.S. Pat. No. 3,288,603. Typical suitable organic photoconductive materials include, for example, the combination of 2,5-bis(p-aminophenyl)-1, 3,4-oxadiazole available under the trademark TO 1920 from Kalle and Company, Weisbaden-Biebrich, Germany and Vinylite VYNS, a copolymer of vinyl chloride and vinyl acetate, available from Carbide and Carbon Chemicals Company 1; and the combination of 2,4,7-trinitro-9-fluorenone to polyvinylcarbazole, available under the trademark Luvican 170 from Winter, Wolf and Company, New York, N.Y. The thickness of the photoconductive layer 3 is not critical to the practice of the invention and any thickness which provides gain photocurrent may be utilized.

As previously stated, any combination of material for electrodes 1 and 4, insulating layer 2 and photocoductive layer 3 can be utilized to obtain gain photocurrent in accordance with the present invention. However, enhanced results are obtained in particularly preferred embodiments when the characteristics of the electrodes, insulating layer and photoconductive layer are matched. The matching of these characteristics are as follows. When the photoconductive material preferentially conducts positive charge or holes to a greater extent than it conducts negative charge or electrons, then the electrode material is preferentially selected to have a high work function greater than about 4 eV and the insulating layer preferentially has a low ionization potential of below about 8 eV. On the other hand, when the photoconductive layer preferentially conducts electrons to a greater extent than it conducts holes, then the electrode preferentially has a low work function of below about 4 eV and the insulating layer preferentially has a high electron affinity greater than about 1.5 eV.

Exemplary photoconductive materials which preferentially conduct positive charges over negative charges include, for example, the photoconductive alloys such as, for example, arsenic triselenide and organic materials such as, for example, sensitized polyvinyl carbazole sensitized, for example, with selenium or selenium alloys or sensitizing dyes.

Exemplary examples of photoconductive materials which preferentially conduct negative charges over positive charges include sensitized zinc oxide in a binder and photoconductive sulfur containing compounds such as, for example, cadmium sulfide and cadmium sulfo-selenide. Ambipolar photoconductive materials, that is, those which conduct positive and negative charges with equal facility and exhibit no preferential conduction include, for example, selenium and selenium alloys doped with small amounts of arsenic, and polyvinyl carbazole containing a large amount of 2,4,7,-trinitro-9-fluorenone. As indicated above, ambipolar materials may be satisfactorily employed in the practice of the present invention.

It has been found through experimentation that gain photocurrent is obtained in accordance with the practice of the present invention when the thickness ratio of photoconductive layer to insulating layer is at least about 10 to 1, or greater.

Any suitable biasing means 8 is placed between insulating layer 2 and photoconductor 3. Typically the biasing means is a thin layer of conductive or semi-conductive material having an electrical conductivity greater than that of the photoconductive material in a particular embodiment of the biased gain photocurrent device.

For example, when the photoconductive layer is arsenic triselenide, the biasing layer is typically any useful material having a lower resistivity such as, aluminum, beryllium, cadmium, copper, gold, indium, iron, lithium, nickel, platinum, potassium, selenium, silver, tin, zinc mixtures and compounds thereof. Semiconductors such as indium antimonide, indium arsenide, gallium arsenide and gallium phosphide are also typically useful.

Alternatively, the biasing means can be a layer of charge (ions) trapped between insulator 2 and photoreceptor 3.

For practical use, the material used for biasing means 8 is chosen to be easily applied in thin layers which are sometimes at least partially transparent. Preferred embodiments of rapid gain photocurrent device 10 use gold and selenium layers as biasing means 8.

The increased conductivity of biasing means 8 compared with that of the photoconductive layer causes a buildup of charge at the interface between photoconductor layer 3 and insulator 2 in the region of biasing means 8 when electrodes 1 and 4 are electrically connected and the work function of biasing means 8 and electrode 1 are different. When electrodes 1 and 4 are connected by a field creating electrical power source such as 5 in FIG. 1, the charge buildup is greater and occurs even when the work function of biasing means 8 and electrode 1 are substantially the same.

For best operation of the invention it is preferred that the work function relationship between electrode 1 and biasing layer 8 be such that electrons are accumulated in the region of biasing layer 8 when a photoconductor is used which preferentially transports electrons and that positive charge are accumulated in the region of biasing layer 8 when a photoconductor is used which preferentially conducts holes.

As described in copending application Ser. No. 489,285, mentioned above, in normal gain photocurrent devices the light 6 impinging on the photoreceptor through transparent electrode 4 causes a flow of current across the photoreceptor so that there is a buildup of charge at the interface between the photoreceptor and the insulator until the charge is sufficiently large to cause thermal tunneling through the insulator so that gain photocurrent is achieved. There is a delay in the appearance of the photocurrent after the photoreceptor has been exposed to light while the charge buildup occurs. Depending on the strength of the activating light, the delay in a typical device may be from less than $\frac{1}{2}$ second (at a light intensity of $1.61 \times 10^{13}$ photons/cm$^2$/sec.) to almost 5 second (at a light intensity of $9.26 \times 10^{11}$ photons/cm$^2$/sec.) in a gain photocurrent device having an about 8 micron thick arsenic triselenide photoconductive layer in contact with a 100 A phenoxy insulating layer under an applied voltage of about 120v. between indium oxide and gold electrodes. It is determined that a charge buildup sufficient to create a field strength of $3 \times 10^6$ V/cm is required prior to the appearance of a photocurrent in this embodiment.

In the present invention the buildup of charge provided by biasing means 8 at least substantially takes the place of the pre-tunneling buildup previously required. When light 6 strikes photoreceptor 3 in a device of the present invention, which is otherwise similar to the device described above, the gain photocurrent is observed without delay.

Figure 2:
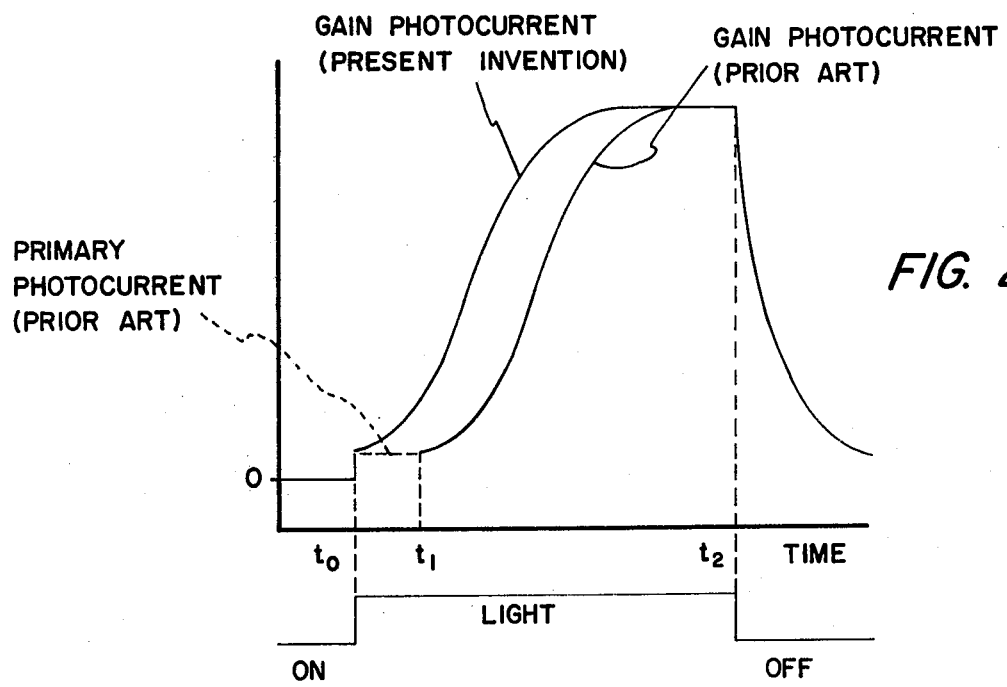
FIG. 2 is a graphical plot of photocurrent versus time for a device according to the present invention and for a device according to the invention described in copending application Ser. No. 489,285, filed July 17, 1974, described above.

FIG. 2 generally illustrates the typically observed photocurrent behavior in time in conjunction with excitation light for both a typical prior art device and a device of the present invention.

Turning to the device of the prior art, at time equal $t_o$, the excitation light is turned on and one observes a steady state primary photocurrent. At time equal $t_1$, the photocurrent goes into the gain mode and then grows until it reaches a mximum gain current. At time equal $t_2$, the excitation light is turned off; the current decreases, eventially returning back to the dark current level. With repetitive experimentation in various embodiments, it is determined that for any particular device, the quantity or total charge conducted through the photoconductor before the onset of the gain photocurrent of secondary current is substantially constant (about 0.6$\mu$C/cm$^2$) and substantially independent of excitation light and applied voltage. That is, in the various embodiments, a field of $3 \times 10^6$ V/cm is built up across the insulating layer before the gain photocurrent is observed.

As can be seen from the FIG. 2 illustration, the secondary photocurrent gives greater than unity. This portion of the photocurrent is typically referred to, and is herein denoted, gain photocurrent. Phenomenologically, it is theorized that in the device of the prior art as excitation light excites the photoconductor and thereby creates a pair of charge carriers, the positive charge moves toward the negative electrode and the negative charge moves towards the positive electrode. All charges of one polarity build up at the interface of the photoconductor and the electrode with which it is in contact and all charges of the other polarity move toward the insulating layer and build up at the interface between the insulating layer and the photoconductive layer with which it is in contact. At time $t_1$, the total charge at those interfaces is sufficient to create a critical electrical field across the insulating layer (about $3 \times 10^6$ V/cm). At this point, charge injection into the valence band of the insulating material through thermally assisted tunneling becomes significant. The velocity of the tunneling charges in the insulating layer is very high, so that probability of recombination with charges of opposite polarity is small. As the excitation light keeps generating more charges at the interfaces, the electrical field across the insulating layer increases. This makes the insulating layer more transparent to tunneling charges, and the gain current increases until the generation and combination of charges each equilibrium. Experimental results are in general agreement with this theory and reveal that for any particular device the maximum gain photocurrent increases proportionally to the square of the voltage applied across the device.

In the present invention, however, biasing means 8 aids in providing the buildup of charge of about $3 \times 10^6$ V/cm at the photoconductor-insulating layer interface to effect gain photocurrent quickly when the activating light impinges the photoreceptor. Referring again to FIG. 2 it is seen that when the light is switched on at time $t_o$ the gain photocurrent (present invention) occurs promptly and reaches about the same peak intensity as the gain photocurrent (prior art), but sooner. The gain photocurrent (present invention) decreases in intensity along the same curve as the gain photocurrent (prior art) when the light is switched off at time $t_2$.

In the present invention the charge buildup at the photoreceptor-insulating layer interface by biasing means 8 replaces at least a major portion of the pre-gain total charge provided by the primary current of the prior art devices and avoids the delay between $t_o$ and the appearance of the gain photocurrent.

FIG. 2 represents an embodiment of the present invention in which the work functions of biasing material 8 and electrode 1 are substantially the same. It is observed that in embodiments using a biasing material 8 which has a work function different from electrode 1 the gain photocurrent not only appears promptly but also is of greater magnitude. For example, an embodiment of the present invention in which electrode 1 is aluminum oxide and biasing means 8 is gold, the gain photocurrent is observed to be at least 5 times greater than the gain photocurrent of the prior art.

Referring again to FIG. 2, it can be seen that the practice of the present invention presents a fast acting electrical switch in which the gain photocurrent is provided upon turn-on of the excitation light and is extinguished subsequent to the turn-off of the excitation light. Accordingly, the present invention lends itself very conveniently to the utilization of imaging layers, materials and systems which utilize either electrical fields, charge injection, or current flow in their imaging scheme.

Figure 3:
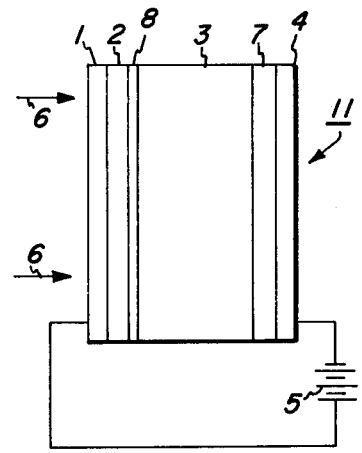
FIG. 3 is a schematic illustration of a biased gain photocurrent device used in conjunction with an imaging layer to enhance the imaging of said layer.

FIG. 3 schematically illustrates one embodiment wherein the present invention is applied to an imaging layer 7. It can be seen from FIG. 3 that the biased gain photocurrent device 11 structure is in all respects identical with that of FIG. 1 except that an imaging layer 7 is sandwiched between photoconductor layer 3 and electrode 4. In the embodiment schematically illustrated by FIG. 3, imaging layer 7 can conveniently be any suitable layer of material or combination of materials. For example, imaging layer 7 can be a liquid crystalline of materials. For example, imaging layer 7 can be a liquid crystalline composition which exhibits dynamic scattering in the areas of current flow. In this case, the configuration of the current flow or gain photocurrent from the photoconductor and through the liquid crysal material of imaging layer 7 will determine the areas of imaging layer 7 which exhibit dynamic scattering. Electrodes 1 and 4 can be shaped in image configuration in order to provide imagewise configured gained photocurrent; or, alternatively, the exciting light 6 can be in imagewise configuration thereby causing the gain photocurrent to be exhibited in portions of imaging layer 7 corresponding to the portions of photoconductive layer 3 struck by the excitation light. In a typical fast-acting gain photocurrent device of the present invention electrodes 1 and 4 are preferentially transparent.

For a more detailed description of liquid crystalline material, methods, apparatus and utilizations, wherein light can be diffusely scattered, or dynamically scattered to thereby provide imaging, see U.S. Pat. Nos. 3,592,527; 3,722,998 and 3,761,172. Speaking generally, such liquid crystalline materials comprise nematic mesophases and mixtures of nematic and cholesteric mesophases wherein an applied voltage causes the selective diffusing and scattering of the selectively transmitted and reflected light.

Imaging layers and systems suitable for use in conjunction with the fast-acting gain photocurrent device of the present invention include any imaging layer or system which can be imaged by application of a voltage which subjects the layer to either an electrical field, current or charge carrier flow, or the capture of charges such as for example, that of U.S. Pat. No. 3,645,729.

Imaging layer 7 may comprise any suitable display layer such as, for example, electrochromic displays. Such displays are readily known to those skilled in the art and will not be described in detail herein. Such displays include selective electroplating, pH changes in chemical compounds leading to a color change, reduction-oxidation reactions such as, for example, the formation of oxides of the transition metals, and a whole host of materials the optical properties of which change as a result of electric charge being trapped by said materials.

Typical suitable liquid crystalline field-effects include, for example, the optically negative to optically positive phase transformation disclosed in U.S. Pat. No. 3,652,148; the twisted nematic to nematic transformation disclosed in U.S. Pat. No. 3,731,986; the Grandjean to focal-conic texture transformation disclosed in U.S. Pat. No. 3,642,348; and, the nematic field-effects such as, for example, the uniaxial to biaxial transformation disclosed in U.S. Pat. No. 3,687,515. Generally speaking, liquid crystalline field-effects are obtained in accordance with the practice of the present invention provided (1) the photoconductor has a dark resistance sufficiently greater than that of the liquid crystalline material such that the electrical field which resides across the liquid crystalline material in the dark is below that required for imaging, and (2) in the presence of light, the resistance of the photoconductor is decreased to a value sufficiently low such that an electrical field is produced across the liquid crystalline material sufficient to produce the field-effect.

It will be readily appreciated by those skilled in the art that the gain photocurrent provided by the present invention decreases the amount of light otherwise required for the imaging of such displays and additionally provides more current per applied voltage than would otherwise be the case in the absence of the gain photocurrent provided by the practice of the present invention.

Further, it is noted that the voltage source 5 in FIGS. 1 and 3 is schematically illustrated as a D.C. voltage source. The advantageous gain photocurrent according to the practice of the present invention is provided only by the utilization of a direct current voltage source. An alternating current voltage source does not provide the gain photocurrent of the present invention because the oscillation of charges does not yield a sufficient electrical field across the insulating layer at $t_o$ (FIG. 2) for gain photocurrent. The voltage source 5 polarity is connected to the electrodes 1 and 4 in a manner that causes the more mobile charge carrier of the charge carrier pairs created by excitation light impinging the photoconductive layer to move away from the insulating layer. That is, in FIGS. 1 and 3, the polarity is connected such that the mobile charge carrier moves away from electrode 1 and towards electrode 4. Thus, when the photoconductor utilized preferentially conducts positive charge then the negative polarity of voltage source 5 is connected to electrode 4; conversely, when the photoconductor employed preferentially conducts negative charges then the positive polarity of the voltage source 5 is connected to electrode 4.

The following examples further specifically illustrate various preferred embodiments of the present invention. Parts and percentages are by weight unless otherwise indicated.

EXAMPLE I

A fast acting gain photocurrent device representative of that of FIG. 1 is prepared as follows:

A glass substrate overcoated with a thin, transparent indium oxide conductive layer is utilized as electrode 1. The electrode is prepared by cleaning with a solution of Alcanox in an ultrasonic bath for about 30 minutes. This cleaning is followed by an about 5 minutes rinsing in running hot water and then in an about 5 minute rinsing in running deionized water. The electrodes are subsequently air-dried for 1 hour in an oven at about 60° C.

A phenoxy insulating layer is next applied over the indium oxide layer of one of the electrodes by dip coating. The thickness of the phenoxy layer is controlled by varying the concentration of a phenoxy resin solution comprising 2-methoxyethyl acetate and methyl ethyl ketone. A 1 to 1 volume ratio of the two solvents is utilized and the phenoxy resin is added in an amount which constitutes about 0.3 weight percent of the resulting solution. The electrode to be coated is dipped in the solution and withdrawn at a rate of about 5.6 centimeters per minute. The resulting thickness of the phenoxy insulating layer is determined by multiple beam interferrometry, transmission electron microscopy, and U.V. absorption measurements, to be about 100A.

The electrical biasing means is a layer of selenium which is vacuum deposited on the phenoxy layer. The selenium is chosen because it is more conductive than the arsenic triselenide which will be used as a photoconductive layer. The selenium layer is deposited in a vacuum of about $1 \times 10^{-5}$ Torr by radiant heating at about 85° to about 90° C. by evaporation of selenium from a "Knudsen cell" type tantalum boat. The thickness of the selenium layer is determined to be about 100A by multiple beam interferrometric measurements.

An arsenic triselenide photoconductive layer is then deposited over the phenoxy insulating layer by vacuum evaporation. The phenoxy coated electrode is first baked out in a vacuum of about $1 \times 10^{-5}$ Torr by radiation heating at about 85° to about 90° C. for about 1 hour. The arsenic triselenide is evaporated from a "Knudsen cell" type tantalum boat. The thickness of the photoconductor layer is controlled by the amount of photoconductive material placed in the boat. A revolving wheel to which the phenoxy coated electrode is attached is utilized during evaporation to ensure uniform thickness of the resulting photoconductor layer. During evaporation of the arsenic triselenide, the temperature of the phenoxy coated electrode is maintained at about 45° to about 50° C. in order that the resulting photoconductive layer of arsenic triselenide has good appearance and mechanical properties. The amount of arsenic triselenide placed in the boat is such that the resulting photoconductive layer has a thickness of about 8 microns, determined by multiple beam interferrometric measurements. Subsequently, a gold electrode is evaporated onto the free surface of the arsenic triselenide layer. The gold electrode in contact with the photoconductive layer is then connected to the negative terminal of a variable D.C. voltage source and the positive terminal therof is connected to the electrode in contact with the phenoxy insulating layer.

EXAMPLE II

The procedure of Example I is generally followed to produce fast acting gain photocurrent devices except that in each device the biasing means material and the material which comprises the photoconductive layer are substituted with the materials shown in Table II.

TABLE II

| Biased Gain Photocurrent Device | Biasing Means | Material |
|---|---|---|
| a | Gold | Polyvinyl carbazole |
| b | Aluminum | Zinc Oxide |
| c | Silver | Cadmium Sulfide |
| d | Nickel | Cadmium sulfo-selenide |
| e | Mercury | Polyvinyl carbazole with 2,4,7-trinitro-9-fluorenone |

Additional samples of each of biased gain photocurrent devices a–e and the device in Example I are made by substantially the same process described in Example I except that in a sample of each of such devices the insulating layer is, in turn, poly (2-propene-2-anthracene), polyvinyl carbazole, a 73/30 weight percent copolymer of styrene and hexylmethacrylate and polystyrene.

An electrical field is placed across each of the devices so constructed and a measuring device is attached to the field circuit so that the time of the occurrence of the gain photocurrent may be noted. Light 6 (see FIG. 1) in the wavelength of about 454nm at a flux of about $4.58 \times 10^{11}$ photons/cm²/sec. are caused to impinge the photoconductor through transparent electrode 4 (see FIG. 1). The time of the occurrence of the gain photocurrent is observed with respect to the time of the light impinging the photoreceptor. In each test the gain photocurrent is observed without delay when the photoreceptor is impinged with light.

EXAMPLE III

A fast acting gain photocurrent device is constructed generally according to the procedure set out in Example I except that a biasing material is not placed between the photoconductor and the insulating layer. Instead, the insulating layer is prepared as in Example I and then uniformly charged with a corotron with a positive charge of sufficient strength to create a field of about $3 \times 10^6$ v/cm across the insulating layer. The charged layer is then coated with a photoconductor, and an electrode is connected to the photoconductor as described in Example I.

The biased gain photocurrent device of Example III is examined by the test of Example II to determine when the gain photocurrent occurs with respect to the time at which the light impinges the photoreceptor. The gain photocurrent is observed to occur without delay.

EXAMPLE IV

Fast acting gain photocurrent imaging devices according to FIG. 3 are prepared substantially in accordance with the methods set out in Examples I and III except that an imaging layer is sandwiched between the photoconductive layer and the electrode attached thereto. The imaging layer comprises a 13 micron layer of liquid crystal material placed between the photoconductor and the transparent electrode 4 (see FIG. 3). The liquid crystal material is sealed in place with epoxy resin. The particular liquid crystal material of this example comprises 80 percent p-methoxybenzylidene-p-n-buytlaniline (MBBA) and 20 weight percent cholesterol oleyl carbonate (COC). The device active area is about 4 cm².

An excitation light having a wavelength of about 545 nm and a flux of about $9.2 \times 10^{13}$ photons/cm²/sec. is caused to impinge the photoconductor of both devices in imagewise configuration. Each device is observed to determine the time of the occurrence of an imagewise pattern in the imaging layer with respect to the time of the imagewise pattern of light striking the device. The imagewise pattern is observed to occur in the imaging layer without delay.

EXAMPLE V

Fast acting gain photocurrent devices similar to those shown in FIG. 1 are made by substantially the same process as described in Example I except that the transparent electrode is indium oxide coated on a glass substrate and the insulating layer is a 300a layer of zinc sulphate. In one device the biasing material is selenium and in a second device the biasing material is indium.

Both devices are tested by the test procedure of Example II. In the device with the selenium biasing layer the gain photocurrent appears promptly upon illumination and reaches its peak in about 1.5 seconds. In the device with the indium biasing layer the gain photocurrent appears promptly and peaks in about 1.0 second.

A gain photocurrent device of the prior art is constructed similar to the two described just above except that no biasing layer is provided. The prior art device is tested by the same procedure, and the gain photocurrent is observed to occur after a delay and to peak at about 3.5 seconds.

EXAMPLE VI

A gain photocurrent device of the prior art and a fast acting gain photocurrent device of the present invention are constructed wherein the transparent electrode is glass coated with aluminum (work function 3.38 eV) and the second electrode is gold. In the fast acting device the biasing layer material is a thin coating of gold (work function 4.21 eV) deposited on the insulating layer. In both devices the insulating layer is a 300A coating of zinc sulfide.

The two devices are tested by the procedure of Example II. In the fast acting device the gain photocurrent not only occurs more quickly than in the prior art device but is of a magnitude of about 5 times that of the prior art device.

It will be appreciated that other variations and modifications will occur to those skilled in the art upon a reading of the present disclosure. These are intended to be within the scope of this invention.

What is claimed is:

1. A fast-acting gain photocurrent device comprising:
   (a) a first electrode comprising material having a work function greater than about 4eV;
   (b) an insulating layer having an ionization potential below about 8eV in contact with said first electrode;
   (c) a biasing layer comprising material selected from the group consisting of conductive and semiconductive material in contact with said insulating layer;
   (d) a photoconductive layer having an electrical conductivity less than said biasing layer and which preferentially conducts positive charge over negative charge in contact with said biasing layer; and
   (e) a second electrode in contact with said photoconductive layer, the thickness ratio of said photoconductive layer to said insulating layer being at least about 10 to 1.

2. The device of claim 1 wherein said first and second electrodes are in electrical contact with a DC voltage source.

3. The device of claim 1 wherein said photoconductive layer comprises material selected from the group consisting of arsenic triselenide, sensitized polyvinyl carbazole, selenium, selenium alloys and mixtures thereof.

4. The device of claim 1 wherein said insulating layer comprises an insulating material selected from the group consisting of zinc sulfide, phenoxy resin, poly (2-propeneanthracene), poly (92-vinyl-anthracene), poly [1-(2-anthryl) ethyl methacrylate], polystyrene, polyvinyl carbazole, polyethylene, polycarbonate resins and mixtures thereof.

5. The device of claim 1 wherein said first and second electrodes comprise material selected from the group consisting of platinum, copper, gold, tin oxide and indium oxide.

6. The device of claim 1 further including an imaging layer sandwiched between said photoconductive layer and said second electrode, said imaging layer comprising material having at least one optical property which undergoes change when subjected to an applied voltage.

7. The device of claim 6 when said imaging layer comprises a material selected from the group consisting of nematic liquid crystalline materials, cholesteric liquid crystalline materials and mixtures thereof.

8. The device of claim 7 wherein the imaging layer comprises about 80% by weight p-methoxy-benzylidene-p-n-butyl aniline and about 20% by weight cholesterol oleyl carbonate.

9. A fast-acting gain photocurrent device comprising:
 (a) a first electrode comprising material having a work function below about 4eV;
 (b) an insulating layer having an electron affinity greater than about 1.5eV in contact with said first electrode;
 (c) a biasing layer comprising material selected from the group consisting of conductive and semiconductive material in contact with said insulating layer;
 (d) a photoconductive layer having an electrical conductivity less than said biasing layer and which preferentially conducts negative charge over positive charge in contact with said biasing layer; and
 (e) a second electrode in contact with said photoconductive layer; the thickness ratio of said photoconductive layer to said insulating layer being at least about 10 to 1.

10. The device of claim 9 wherein said photoconductive layer comprises material selected from the group consisting of sensitized zinc oxide, cadmium sulfoselenide and mixtures thereof.

11. The device of claim 9 wherein said first and second electrodes comprise material selected from the group consisting of silver, tin, aluminum and indium.

12. The method of generating gain photocurrent promptly in response to impinging light comprising:
 (a) providing a fast-acting gain photocurrent device comprising a first electrode comprising material having a work function greater than about 4eV, an insulating layer having an ionization potential below about 8eV in contact with said first electrode, a biasing layer comprising materials selected from the group consisting of conductive and semiconductive material in contact with said insulating layer, a photoconductive layer having an electrical conductivity less than said biasing layer and which preferentially conducts positive charge over negative charge in contact with said biasing layer, and a second electrode in contact with said photoconductive layer, the thickness ratio of said photoconductive layer to said insulating layer being at least about 10 to 1;
 (b) applying a DC voltage across said device; and
 (c) impinging said photoconductive layer with light having a wavelength within the fundamental absorption band of the photosensitive material in said photoconductive layer whereby a primary current is excited within said photoconductive layer which combines with a field across said insulating layer created by said biasing layer to promptly provide gain photocurrent.

13. The method of imaging comprising:
 (a) providing a fast-acting gain photocurrent device comprising a first electrode comprising material having a work function greater than about 4eV, an insulating layer having an ionization potential below about 8eV in contact with said first electrode, a biasing layer comprising materials selected from tne group consisting of a conductive and semiconductive material in contact with said insulating layer, a photoconductive layer having an electrical conductivity less than said biasing layer and which preferentially conducts positive charge over negative charge in contact with said biasing layer, an imaging layer having at least one optical property which undergoes change when subjected to an applied voltage in contact with said photoconductive layer, and a second electrode in contact with said imaging layer, the thickness ratio of said photoconductive layer to said insulating layer being at least about 10 to 1.
 (b) applying a DC voltage across said device; and
 (c) impinging said device with light in imagewise configuration, said light having a wavelength within the fundamental absorption band of the photoconductive material within said photoconductive layer whereby a primary current is excited within said photoconductive layer which combines with an electrical bias across said insulating layer supplied by said biasing layer to promptly achieve a gain photocurrent which is sufficient to change the optical property of said imaging layer in imagewise configuration.

* * * * *